(12) United States Patent
Sutardja

(10) Patent No.: US 7,091,565 B2
(45) Date of Patent: Aug. 15, 2006

(54) EFFICIENT TRANSISTOR STRUCTURE

(75) Inventor: Sehat Sutardja, Los Altos Hills, CA (US)

(73) Assignee: Marvell World Trade Ltd., St. Michael (BB)

(*) Notice: Subject to any disclaimer, the term of this patent is extended or adjusted under 35 U.S.C. 154(b) by 4 days.

(21) Appl. No.: 10/691,237

(22) Filed: Oct. 22, 2003

(65) Prior Publication Data

US 2005/0110056 A1    May 26, 2005

(51) Int. Cl.
*H01L 29/76* (2006.01)
(52) U.S. Cl. .................................. 257/401; 257/773
(58) Field of Classification Search .............. 257/401, 257/343, 347, 773
See application file for complete search history.

(56) References Cited

U.S. PATENT DOCUMENTS

| | | | |
|---|---|---|---|
| 6,281,549 B1 * | 8/2001 | Davies | 257/343 |
| 6,740,930 B1 * | 5/2004 | Mattei et al. | 257/329 |
| 6,867,083 B1 * | 3/2005 | Imam et al. | 438/212 |
| 2005/0110056 A1 * | 5/2005 | Sutardja | 257/288 |

* cited by examiner

*Primary Examiner*—Mark V. Prenty

(57) ABSTRACT

An integrated circuit includes a first source, a first drain, and a first gate that is arranged between the first source and the first drain. A first body is arranged inside of and is surrounded by the first source. The source and the drain include $n^+$ regions and the body includes a $p^+$ region. The first body tapers as a distance between a midportion of the first body and the first gate decreases. The first body is in contact with the first gate or spaced from the first gate.

15 Claims, 4 Drawing Sheets

EFFICIENT TRANSISTOR STRUCTURE

FIELD OF THE INVENTION

The present invention relates to transistor structures, and more particularly to transistor structures with reduced chip area.

BACKGROUND OF THE INVENTION

Integrated circuits or chips may include a large number of interconnected transistors. The transistors and other circuit elements are interconnected in various ways to provide desired circuit functions. It is usually most efficient to fabricate multiple integrated circuits on a single wafer. After processing, the integrated circuits that are fabricated on the wafer are separated and then packaged. The wafer can accommodate a fixed number of integrated circuits for a given integrated circuit size. Reducing the size of individual transistors in the integrated circuit may help to reduce the overall size of the integrated circuit. This, in turn, allows an increased number of integrated circuits or chips to be made on each wafer and reduces the cost of the integrated circuits.

Referring now to FIGS. 1 and 2, an exemplary transistor 10 includes a drain 12, a gate 14, a source 16 and a body 18 or substrate tap. For example, the transistor 10 in FIG. 1 is an NMOS transistor. In some circumstances, the body 18 is connected to the source 16 as shown in FIG. 2.

Referring now to FIG. 3, the body 18 includes a $p^+$ region and may include a contact tap 30. The source 16 includes an $n^+$ region and may include a contact tap 32. The drain 12 includes an $n^+$ region and may include a contact tap 34. Additional transistors may be fabricated on one or sides of the transistor 10 as indicated by " . . . " in FIG. 3.

Referring now to FIG. 4, the body 18 may be repeated between sources 16 of adjacent transistors. The body 18 takes up valuable chip area and increases the size of the transistor and the integrated circuit. Additional transistors can be arranged on one or more sides of the transistor 10 as shown by " . . . " in FIG. 4.

SUMMARY OF THE INVENTION

An integrated circuit according to the present invention includes a first source, a first drain, and a first gate that is arranged between the first source and the first drain. A first body is arranged inside of and is surrounded by the first source.

In other features, the first source and the first drain include $n^+$ regions and the body includes a $p^+$ region. The first body tapers as a distance between a midportion of the first body and the first gate decreases. The first body has at least one of a diamond shape, a circular shape, an elliptical shape, a hexagon shape, an octagon shape and a football shape. The first body spaced from the first gate.

In other features, a second drain has $n^+$ regions. A second gate is arranged between the first source and the second drain. The first and second gates are connected. The first body includes a body contact tap. The first and second gates are arranged farther apart adjacent to the first body than in areas that are not adjacent to the body contact tap. Alternately, the first source includes a source contact tap. The first and second gates are arranged farther apart adjacent to the source contact tap than in areas that are not adjacent to the source contact tap.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 1:
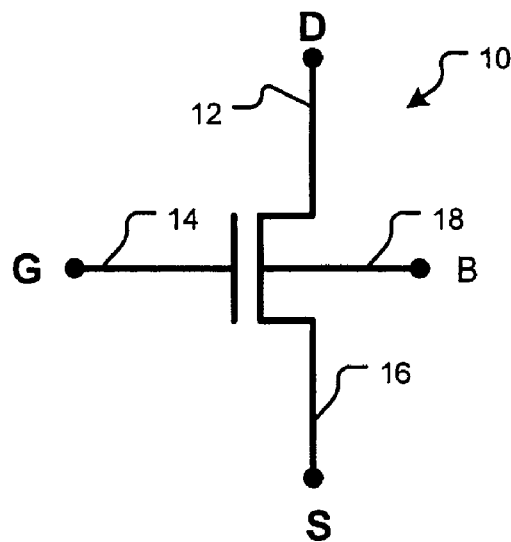
FIG. 1 is an electrical symbol for a transistor with a drain, source, gate and body according to the prior art.
Figure 2:
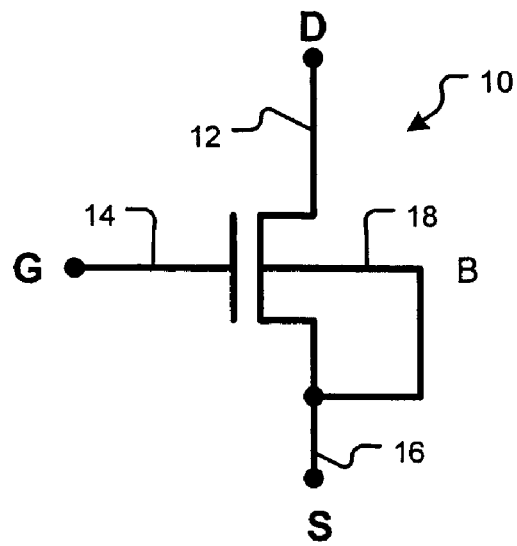
FIG. 2 is an electrical symbol for a transistor with a drain, source, gate and body, which is connected to the source according to the prior art.
Figure 3:
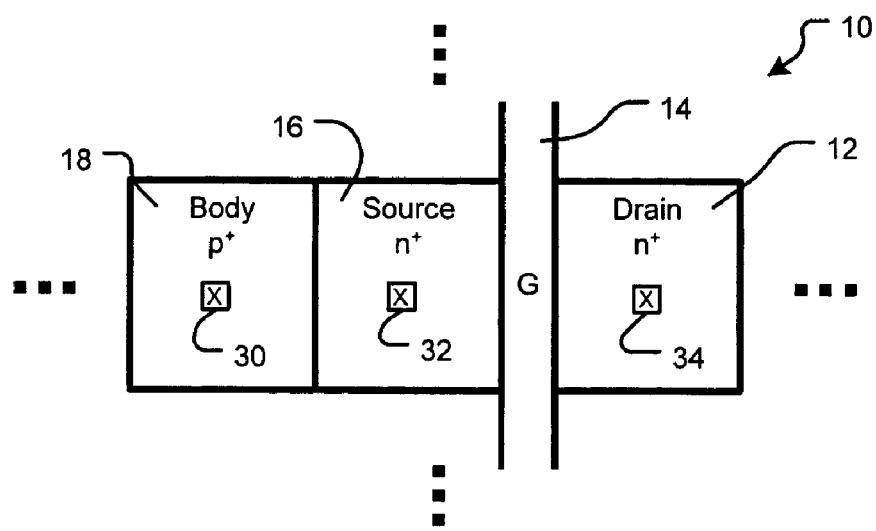
FIG. 3 is an exemplary layout of the transistor of FIG. 2 according to the prior art.
Figure 4:
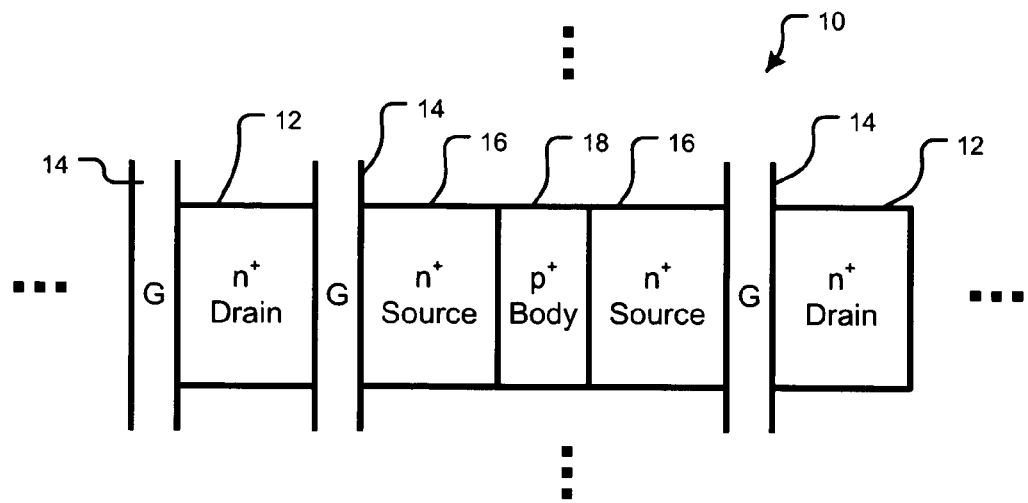
FIG. 4 is an exemplary layout of multiple transistors that are arranged in a row according to the prior art.

The following description of the preferred embodiment(s) is merely exemplary in nature and is in no way intended to limit the invention, its application, or uses. For purposes of clarity, the same reference numbers will be used in the drawings to identify the same elements. Additional transistors can be arranged on one or more sides of the illustrated transistors that are shown in the FIGs. as indicated by " . . . " in the FIGs.

Referring now to FIGS. 5A and 5B, a transistor 50 according to the present invention is shown to include one or more sources 54 and one or more drains 56. The sources 54 and the drains 56 include $n^+$ regions. While an NMOS transistor is shown, skilled artisans will appreciate that the present invention also applies to other types of transistors such as PMOS transistors. Gates 58 are located between adjacent pairs of sources 54 and drains 56. In one implementation, the gates 58 that are located on opposite sides of the sources 54 are connected together as shown at 64. In other configurations, however, the gates 58 need not be connected together.

Figure 5:
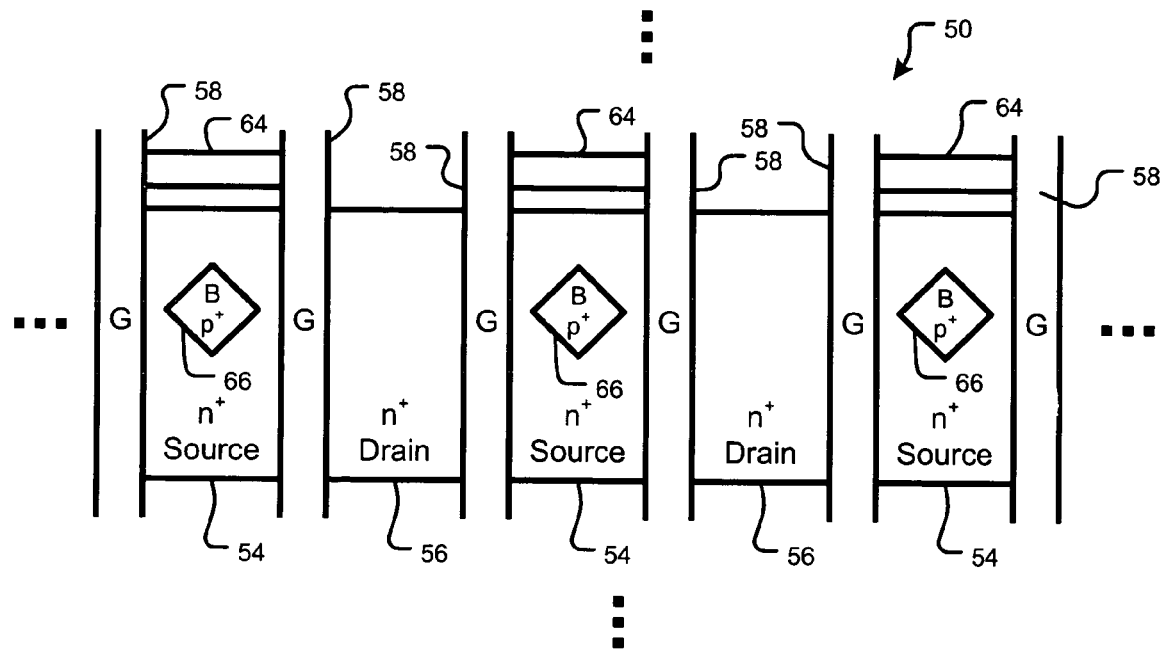
FIG. 5A is a first exemplary layout of transistors including a body that is arranged in the source.
FIG. 5B is a second exemplary layout of transistors including a body that is arranged in the source and that overlaps the gate in plan view.

A body 66 including a $p^+$ region is arranged inside of and is surrounded by the source 54. The body 66 preferably has a shape that tapers as a distance between a midportion of the body 66 and adjacent gates decreases. By utilizing some of the area of the source 54 for the body 66, the overall size of the transistor 50 is reduced as compared to conventional transistors. In the exemplary implementation that is shown in FIG. 5, the body 66 has a diamond shape.

Figure 6:
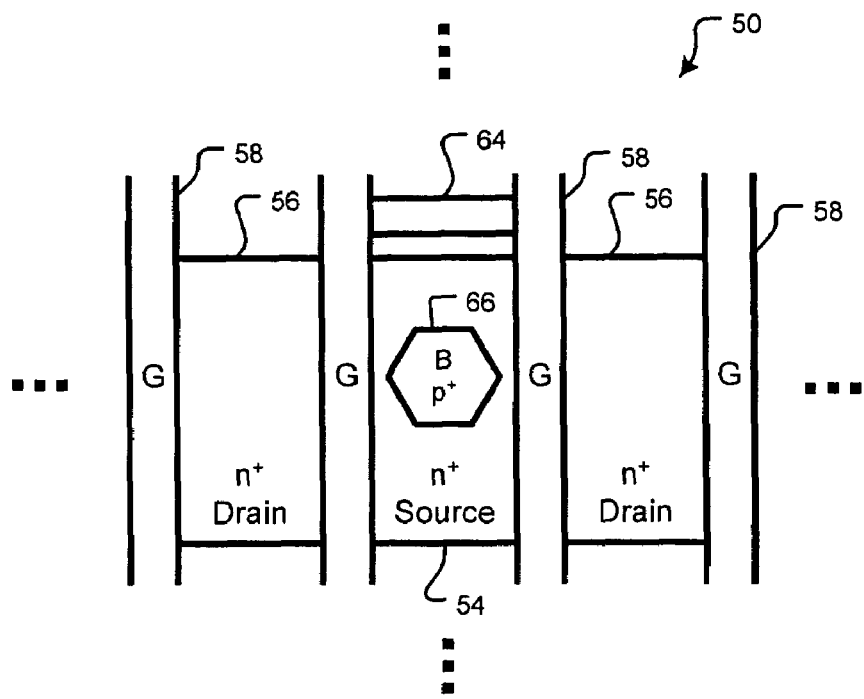
FIG. 6 is a second exemplary layout of transistors including a body that is arranged in the source.
Figure 7:
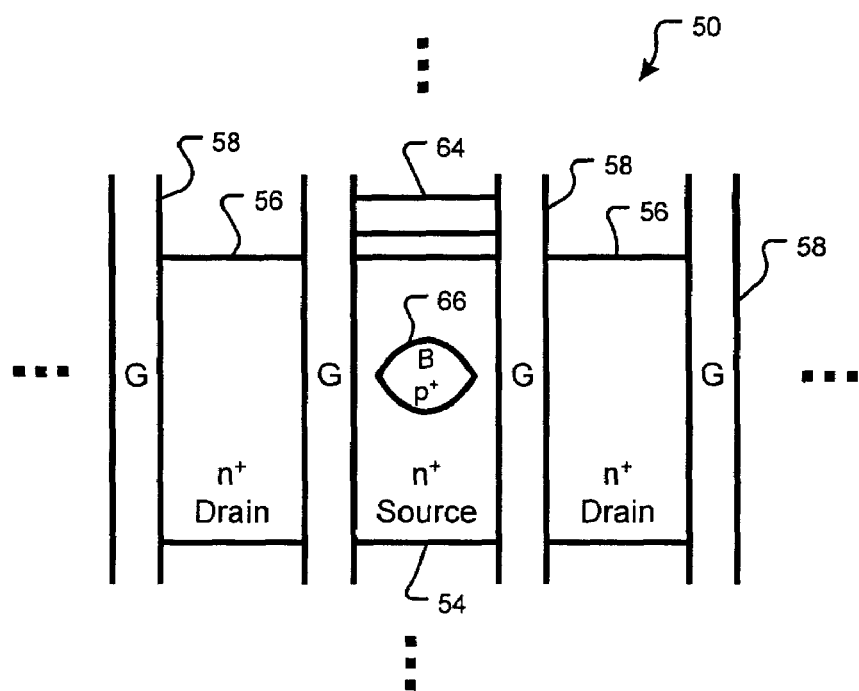
FIG. 7 is a third exemplary layout of transistors including a body that is arranged in the source.
Figure 8:
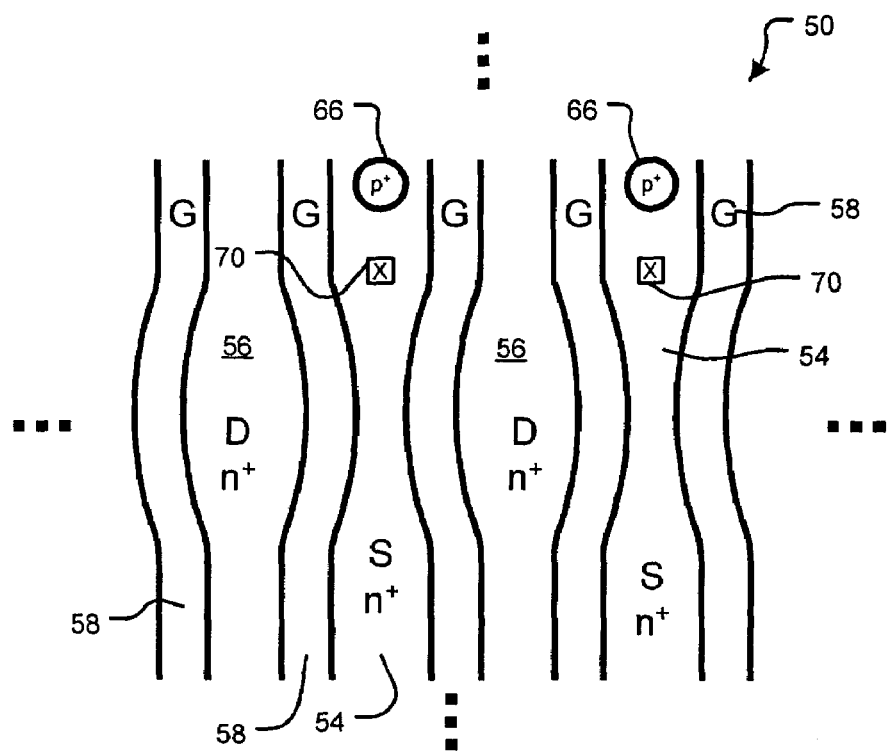
FIG. 8 is a fourth exemplary layout of transistors including a body that is arranged in the source.

Referring now to FIGS. 6 and 7, other exemplary shapes for the body 66 are shown. In FIG. 6, the body 66 has a hexagon shape. In FIG. 7, the body is generally football shaped. Skilled artisans will appreciate that there are a wide variety of other suitable shapes. For example, a circular body is shown in FIG. 8, which is described. Other suitable shapes include an ellipse, an octagon, etc.

Figure 9:
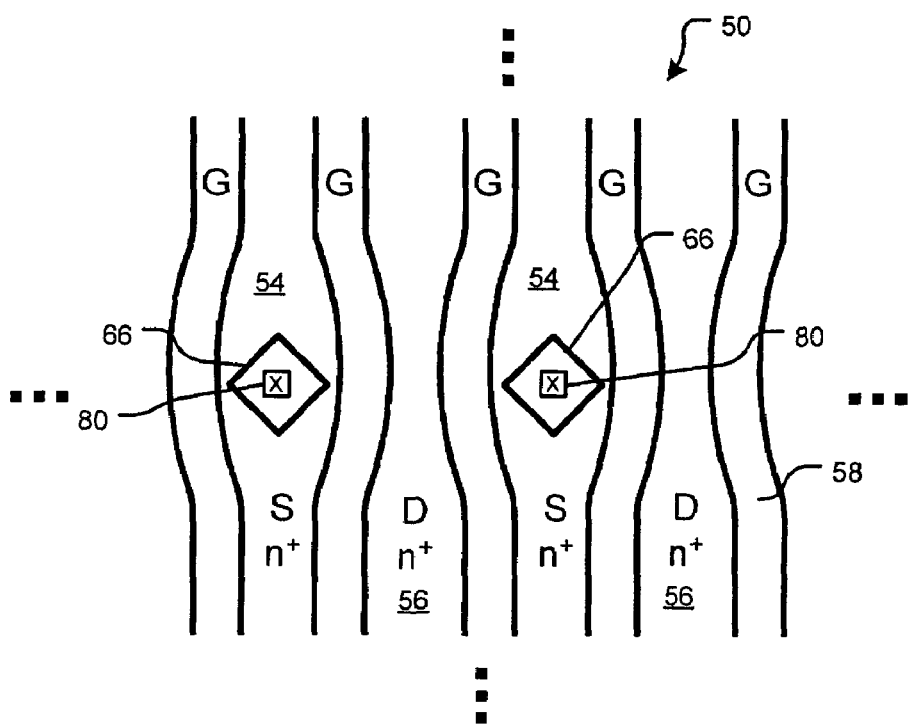
FIG. 9 is a fifth exemplary layout of transistors including a body that is arranged in the source.

Referring now to FIGS. 8 and 9, the gates 58 can be arranged such that they are closer together when there are no contact taps and further apart when there are contact taps. In FIG. 8, a source contact tap 70, which is not located in the body 66, is located in a region where the adjacent gates 58 are located farther apart. In FIG. 9, a body contact tap 80, which is located in the body 66, is located in the source 54 where the adjacent gates 58 are located farther apart.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. An integrated circuit comprising:
   a first source;
   a first drain;
   a first gate that is arranged between said first source and said first drain;
   a first body that is arranged inside of and is surrounded by said first source;
   a second drain; and
   a second gate that is arranged between said first source and said second drain,
   wherein said first body includes a body contact tap and wherein said first and second gates are arranged farther apart adjacent to said body contact tap than in areas that are not adjacent to said body contact tap.

2. The integrated circuit of claim 1 wherein said first source, said first drain, and said second drain include $n^+$ regions and said first body includes a $p^+$ region.

3. The integrated circuit of claim 1 wherein said first body tapers as a distance between a midportion of said first body and said first gate decreases.

4. The integrated circuit of claim 1 wherein said first body has substantially at least one of a diamond shaped, a circular shape, an elliptical shape, a hexagon shape, an octagon shape and a football shape.

5. The integrated circuit of claim 1 wherein said first body is spaced from said first gate.

6. The integrated circuit of claim 1 wherein said first and second gates are connected.

7. An integrated circuit comprising:
   a first source;
   a first drain;
   a first gate that is arranged between said first source and said first drain;
   a first body that is arranged inside of and is surrounded by said first source;
   a second drain; and
   a second gate that is arranged between said first source and said second drain,
   wherein said first source includes a source contact tap and wherein said first and second gates are arranged farther apart adjacent to said source contact tap than in areas that are not adjacent to said source contact tap.

8. The integrated circuit of claim 7 wherein said first source, said first drain, and said second drain include $n^+$ regions and said first body includes a $p^+$ region.

9. The integrated circuit of claim 7 wherein said first body tapers as a distance between a midportion of said first body and said first gate decreases.

10. The integrated circuit of claim 7 wherein said first body has at least one of a diamond shape, a circular shape, an elliptical shape, a hexagon shape, an octagon shape and a football shape.

11. The integrated circuit of claim 7 wherein said first body is spaced from said first gate.

12. The integrated circuit of claim 7 wherein said first and second gates are connected.

13. The integrated circuit of claim 3 wherein said first source and said first drain include $n^+$ regions and said first body includes a $p^+$ region.

14. The integrated circuit of claim 4 wherein said first body is spaced from said first gate.

15. The integrated circuit of claim 5 wherein said first and second gates are connected.

* * * * *